US012660128B2

(12) United States Patent
Berolini et al.

(10) Patent No.: US 12,660,128 B2
(45) Date of Patent: Jun. 16, 2026

(54) ELECTRONICALLY INSULATING THERMAL CONNECTOR HAVING A LOW THERMAL RESISTIVITY

(71) Applicant: KYOCERA AVX Components Corporation, Fountain Inn, SC (US)

(72) Inventors: Marianne Berolini, Greer, SC (US); Cory Nelson, Simpsonville, SC (US); Ronald S. Demcko, Raleigh, NC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 366 days.

(21) Appl. No.: 17/891,193

(22) Filed: Aug. 19, 2022

(65) Prior Publication Data

US 2023/0076503 A1 Mar. 9, 2023

Related U.S. Application Data

(60) Provisional application No. 63/242,085, filed on Sep. 9, 2021.

(51) Int. Cl.
H05K 7/20 (2006.01)
H05K 1/02 (2006.01)

(52) U.S. Cl.
CPC ......... H05K 7/2039 (2013.01); H05K 1/0203 (2013.01); *H05K 2201/066* (2013.01)

(58) Field of Classification Search
CPC ............... H05K 7/2039; H05K 1/0203; H05K 2201/066; H05K 1/181; H01L 23/3735; H01L 23/15; H01L 23/49805
See application file for complete search history.

(56) References Cited

U.S. PATENT DOCUMENTS 3,895,272 A * 7/1975 Smolko ................. H01L 27/016
                                                        338/334
4,130,855 A * 12/1978 Smolko ................. H01L 23/142
                                                        361/706
4,410,874 A * 10/1983 Scapple ................. H05K 3/341
                                                        29/613
5,262,834 A 11/1993 Kusaka et al.
5,698,896 A 12/1997 Komatsu et al.
(Continued)

FOREIGN PATENT DOCUMENTS

CN 106058124 A 10/2016
EP 3 168 868 A1 5/2017
(Continued)

OTHER PUBLICATIONS

IMS Product Catalog, Oct. 2015, pp. 1-20.
(Continued)

*Primary Examiner* — Timothy J Thompson
(74) *Attorney, Agent, or Firm* — Dority & Manning, P.A.

(57) ABSTRACT

A heat sink component can include a body including a thermally conductive material that is electrically non-conductive. At least one first terminal can be formed over a first end of the body. At least one second terminal formed over a second end of the body. The second end of the body can be opposite the first end of the body in an X-direction. The heat sink component can have a length in the X-direction and a width in a Y-direction that is parallel with the top surface and perpendicular to the X-direction. A ratio of the width to the length can be greater than about 1.

29 Claims, 8 Drawing Sheets

(56) References Cited

U.S. PATENT DOCUMENTS

| | | | |
|---|---|---|---|
| 5,787,976 | A | 8/1998 | Hamburgen et al. |
| 6,762,395 | B2 | 7/2004 | Yagnik et al. |
| 7,034,641 | B1 * | 4/2006 | Clarke ................ H01S 5/02325 |
| | | | 372/50.1 |
| 7,999,450 | B2 * | 8/2011 | Shiue ................... H10H 20/858 |
| | | | 313/46 |
| 8,803,183 | B2 | 8/2014 | Chang et al. |
| 9,634,214 | B2 | 4/2017 | Yan |
| 9,839,159 | B1 | 12/2017 | Banijamali |
| 9,841,772 | B2 | 12/2017 | Bucher |
| 9,874,316 | B2 | 1/2018 | Yu et al. |
| 10,660,238 | B2 | 5/2020 | Durgin |
| 2005/0168941 | A1 | 8/2005 | Soko et al. |
| 2007/0200127 | A1 * | 8/2007 | Andrews .............. H10H 20/858 |
| | | | 257/E33.072 |
| 2013/0058695 | A1 | 3/2013 | Jensen et al. |
| 2014/0124822 | A1 | 5/2014 | Yan |
| 2014/0254336 | A1 | 9/2014 | Jandric et al. |
| 2014/0335398 | A1 | 11/2014 | Partin et al. |
| 2019/0090381 | A1 * | 3/2019 | Durgin .................... H01L 23/36 |
| 2019/0378891 | A1 * | 12/2019 | Nelson ................... H01C 7/003 |

FOREIGN PATENT DOCUMENTS

| | | | |
|---|---|---|---|
| JP | 2004039691 | A | 2/2004 |
| JP | 2010245563 | A | 10/2010 |

OTHER PUBLICATIONS

Product Information—ATC's Q-Bridge Thermal Conductor from American Technical Ceramics, 1 page.

Product Information—Therma-Bridge by IMS B-Series ver 9, Jun. 6, 2012, pp. 1-2.

Product Information—ATC Q-Bridge Thermal Conductor, Feb. 2015, pp. 1-2.

Product Information—ATC Q-Bridge Thermal Conductor from American Technical Ceramics dated Mar. 2015, 2 pages.

Product Information—ATC Q-Bridge Thermal Conductor from American Technical Ceramics dated Jul. 2015, 2 pages.

Product Information—ATC Q-Bridge Thermal Conductor from American Technical Ceramics dated Feb. 2016, 2 pages.

Product Information—Therma-Plane by IMS ver A-Series, Apr. 2016, pp. 1-2.

Product Information—Therma-Bridge by IMS ver B-Series, Sep. 2016, pp. 1-2.

Product Information—ATC Q-Bridge Thermal Conductor from American Technical Ceramics dated May 2017, 2 pages.

Product Information—ThermaBridge™ Specialty Thick Film Component from International Manufacturing Services, Inc., May 24, 2017, 4 pages.

* cited by examiner

130

110

108

128

150

104

106

120

122

126

180

124

Y

Z

X

500

502 — Provide a body comprising a thermally conductive material that is electrically non-conductive 504 — Provide a body comprising a thermally conductive material that is electrically non-conductive 506 — Form at least one second terminal formed over a second end of the body, the second end of the body being opposite the first end of the body in an X-direction

ELECTRONICALLY INSULATING THERMAL CONNECTOR HAVING A LOW THERMAL RESISTIVITY

CROSS REFERENCE TO RELATED APPLICATION

The present application claims filing benefit of U.S. Provisional Patent Application Ser. No. 63/242,085 having a filing date of Sep. 9, 2021, which is incorporated herein by reference in its entirety.

BACKGROUND OF THE INVENTION

Electrical circuits, such as power amplifier circuits, generate heat during normal operation. Heat build-up may undesirably increase the temperature of the various components of the electrical circuit. If this heat is not sufficiently managed, for example by dissipation to a heat sink, the electrical device may overheat, resulting in damage to the electrical component.

SUMMARY OF THE INVENTION

In accordance with one embodiment of the present invention, a heat sink component can include a body including a thermally conductive material that is electrically non-conductive. At least one first terminal can be formed over a first end of the body. At least one second terminal formed over a second end of the body. The second end of the body can be opposite the first end of the body in an X-direction. The heat sink component can have a length in the X-direction and a width in a Y-direction that is parallel with the top surface and perpendicular to the X-direction. A ratio of the width to the length can be greater than about 1.

In accordance with another embodiment of the present invention, a component assembly can include a circuit board and a heat sink component mounted to the circuit board. The heat sink component can include a body including a thermally conductive material that is electrically non-conductive, a plurality of first terminals formed over a first end of the body, and at least one second terminal formed over a second end of the body. The second end of the body can be opposite the first end of the body in an X-direction. The heat sink component has a length in the X-direction and a width in a Y-direction that is parallel with the top surface and perpendicular to the X-direction. A ratio of the width to the length can be greater than about 1. A plurality of discrete electrical components can be respectively connected with the plurality of first terminals.

In accordance with another embodiment of the present invention, a heat sink component can include a body including a thermally conductive material that is electrically non-conductive; a first terminal, a second terminal, and a third terminal formed on the body; at least one thin film component connected between the first terminal and the second terminal; and a conductive trace electrically connecting the first terminal with the third terminal.

In accordance with another embodiment of the present invention, a method of manufacturing a circuit board including an embedded heat sink component can include providing a body including a thermally conductive material that is electrically non-conductive. The method can include forming at least one first terminal over a first end of the body. The method can include forming at least one second terminal over a second end of the body. The second end of the body can be opposite the first end of the body in an X-direction.

The heat sink component can have a length in the X-direction and a width in a Y-direction that is parallel with the top surface and perpendicular to the X-direction. A ratio of the width to the length can be greater than about 1.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which:

FIG. 10 is a view of a bottom surface of a heat sink component similar to the heat sink component of FIG. 1A;

Figure 1A:
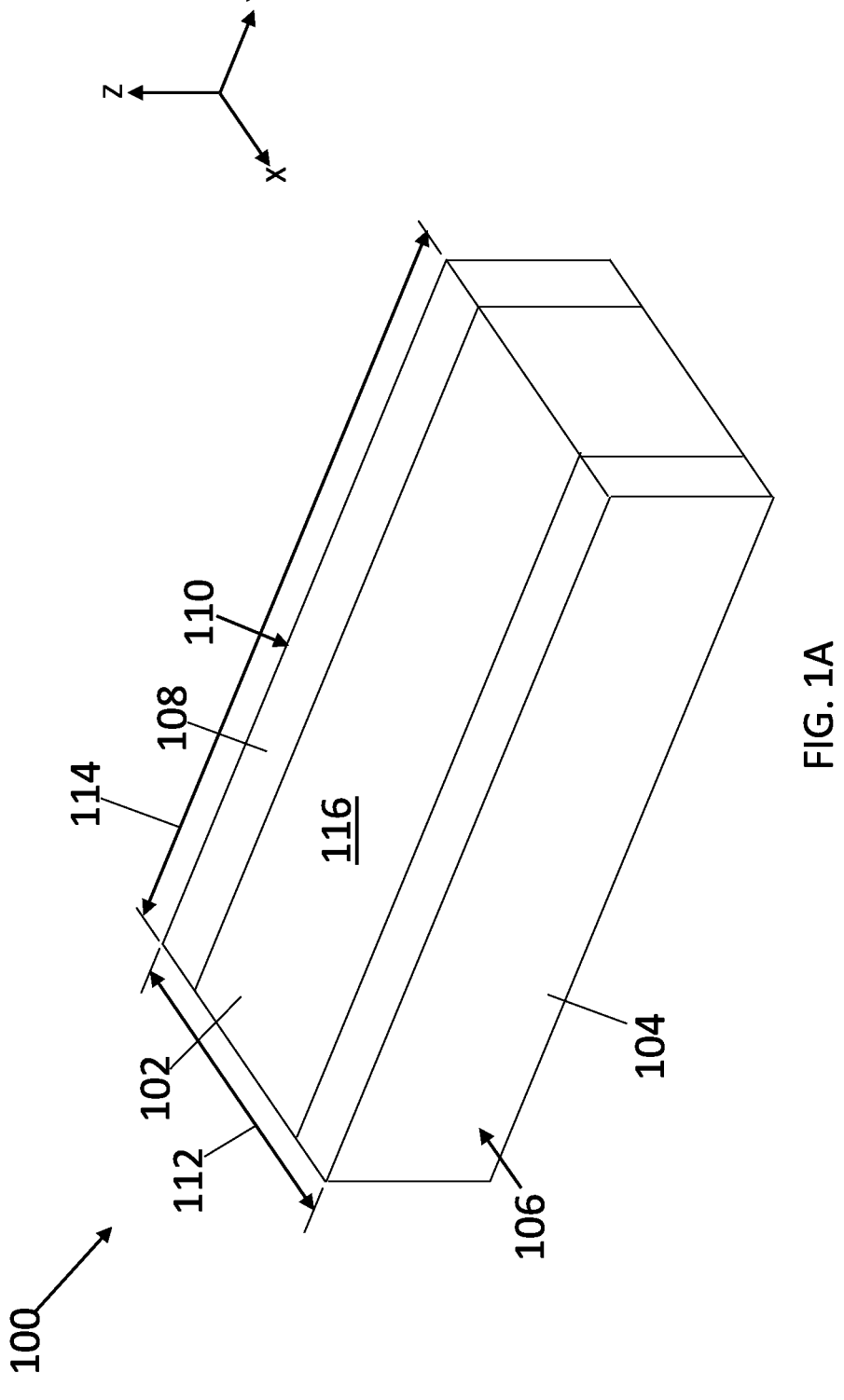
FIG. 1A is a perspective view of an example heat sink component having a ratio of a width to a length that is greater than about 1 according to aspects of the present invention.

Repeat use of reference characters in the present specification and drawing is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to a heat sink component having excellent heat transfer capabilities. The heat sink component can have a reverse geometry such that a length of the heat sink component is less than a width of the heat sink component. The heat sink component can include a body including a thermally conductive material that is electrically non-conductive. At least one first terminal can be formed over a first end of the body and at least one second terminal formed over a second end of the body. The second end of the body can be opposite the first end of the body in an X-direction. The heat sink component can have a length in the X-direction and a width in a Y-direction that is parallel with the top surface and perpendicular to the X-direction. A ratio of the width to the length can be greater than about 1, in some embodiments greater than about 1.2, in some embodiments greater than about 1.3, in some embodiments greater than about 1.5, in some embodiments greater than about 2, in some embodiments greater than about 3, in some embodiments greater than about 4, in some embodiments greater than about 5, in some embodiments greater than about 7, and in some embodiments greater than about 10.

In some embodiments, the heat sink component can include multiple terminals for connecting multiple distinct electrical components. The heat sink component can facilitate heat flow away from the distinct electrical components. Further, in some embodiments, the heat sink component can act as an interposer, provide thin film components between the terminals, and/or include one or more conductive traces selectively connecting various terminals.

A plurality of first terminals can be formed over the first end of the body and can be electrically distinct from each other. In some embodiments, a plurality of second terminals can be formed over the second end of the body and can be electrically distinct from each other.

In some embodiments, the heat sink component can include at least one thin film component. The thin film component can include one or more of a resistor, varistor, capacitor, inductor, and/or combinations thereof, such as a thin film filter. The thin film components may include one or more layers of conductive materials, dielectric materials, resistive materials, inductive materials, or other materials that are precisely formed using "thin film" technology.

As one example, the thin film component(s) can include a thin film varistor. The varistor can include barium titanate, zinc oxide, or any other suitable dielectric material. Various additives may be included in the dielectric material, for example, that produce or enhance the voltage-dependent resistance of the dielectric material. For example, in some embodiments, the additives may include oxides of cobalt, bismuth, manganese, or a combination thereof. In some embodiments, the additives may include oxides of gallium, aluminum, antimony, chromium, titanium, lead, barium, nickel, vanadium, tin, or combinations thereof. The dielectric material may be doped with the additive(s) ranging from about 0.5 mole percent to about 3 mole percent, and in some embodiments from about 1 mole percent to about 2 mole percent. The average grain size of the dielectric material may contribute to the non-linear properties of the dielectric material. In some embodiments, the average grain size may range from about 1 micron to 100 microns, in some embodiments, from about 2 microns to 80 microns.

As another example, the thin film component(s) can include a thin film resistor including one or more resistive layers. For example, the resistive layer may include tantalum nitride (TaN), nickel chromium (NiCr), tantalum aluminide, chromium silicon, titanium nitride, titanium tungsten, tantalum tungsten, oxides and/or nitrides of such materials, and/or any other suitable thin film resistive materials. The resistive layer may have any suitable thickness.

As another example, the thin film component(s) can include a thin film capacitor including one or more dielectric layers. As examples, the dielectric layer(s) may include one or more suitable ceramic materials. Example suitable materials include alumina (Al2O3), aluminum nitride (AlN), beryllium oxide (BeO), aluminum oxide (Al2O3), boron nitride (BN), silicon (Si), silicon carbide (SiC), silica (SiO2), silicon nitride (Si3N4), gallium arsenide (GaAs), gallium nitride (GaN), zirconium dioxide (ZrO2), mixtures thereof, oxides and/or nitrides of such materials, or any other suitable ceramic material. Additional example ceramic materials include barium titanate (BaTiO3), calcium titanate (CaTiO3), zinc oxide (ZnO), ceramics containing low-fire glass, or other glass-bonded materials.

The thin film component can include one or more layers having thicknesses ranging from about 0.001 μm to about 1,000 μm, in some embodiments from about 0.01 μm to about 100 μm, in some embodiments from about 0.1 μm to about 50 μm, in some embodiments from about 0.5 μm to about 20 μm. The respective layer(s) of materials forming thin film component may be applied using specialized techniques based on etching, photolithography, PECVD (Plasma Enhanced Chemical Vapor Deposition) processing, or other techniques.

One or more thin film components can be connected with the first terminal. The thin film components can be connected between the first terminal(s) and the second terminal(s). The thin film components can be connected between respective first terminals at the first end of the body.

The heat sink component can function at least partially as an interposer. The heat sink component can include one or more conductive traces selectively connecting two or more terminals. For example, one or more conductive traces can be connected between a pair of first terminals at the first end of the body. As another example, one or more conductive traces can be connected between the first terminal(s) and the second terminal(s).

Including conductive traces such that the heat sink component at least partially functions as an interposer can reduce the space on a circuit board required to provide the desired electrical connections and heat sink functions (e.g., as compared with using separate interposer components and heat sink components). Similarly, a heat sink component including thin film components as described herein can reduce the space on a circuit board required to provide the desired thin film components and heat sink functions (e.g., as compared with using separate thin film components and heat sink components). In other words, the heat sink component described herein can provide improved functionality while requiring relatively small real estate on a circuit board to which it is mounted.

As examples, the heat sink component can include 2 or more terminals, in some embodiments 4 or more terminals, in some embodiments 8 or more terminals, in some embodiments 10 or more terminals, in some embodiments 12 or more terminals, and in some embodiments 20 or more terminals.

The body of the heat sink component can include a thermally conductive material that is electrically non-conductive. As is known in the art, thermal resistivity and thermal conductivity of a material are inversely related. Thus, a low thermal resistivity correlates with a high thermal conductivity. The body of the heat sink component may include any suitable material having a generally low thermal resistivity (e.g., less than about $6.67 \times 10^{-3}$ m·° C./W), and a generally high electrical resistivity (e.g., greater than about $10^{14}$ Ω·cm). A thermal resistivity of $6.67 \times 10^{-3}$ m·° C./W is equivalent with a thermal conductivity of about 150 W/m·° C. In other words, suitable materials for the body of the heat sink component may have a generally high thermal conductivity, such as greater than about 150 W/m·° C.

For example, in some embodiments, the body of the heat sink component may be made from a material having a thermal conductivity between about 100 W/m·° C. and about 300 W/m·° C. at about 22° C. In other embodiments, the body of the heat sink component may be made from a material having a thermal conductivity between about 125 W/m·° C. and about 250 W/m·° C. at about 22° C. In other embodiments, the body of the heat sink component may be made from a material having a thermal conductivity between about 150 W/m·° C. and about 200 W/m·° C. at about 22° C.

In some embodiments, the body of the heat sink component may comprise aluminum nitride, beryllium oxide, aluminum oxide, boron nitride, silicon nitride, magnesium oxide, zinc oxide, silicon carbide, any suitable ceramic material, and mixtures thereof.

In some embodiments, the body of the heat sink component may comprise aluminum nitride. For example, in some embodiments the body of the heat sink component may be made from any suitable composition including aluminum nitride. In some embodiments, the body of the heat sink component may be made primarily from aluminum nitride. For example, the body of the heat sink component may contain additives or impurities. In other embodiments, the body of the heat sink component comprises beryllium oxide. For example, in some embodiments the body of the heat sink component may be made from any suitable composition including beryllium oxide. In some embodiments, the body of the heat sink component may be made primarily from beryllium oxide. For example, the body of the heat sink component may contain additives or impurities.

Figures 1B, 1C:
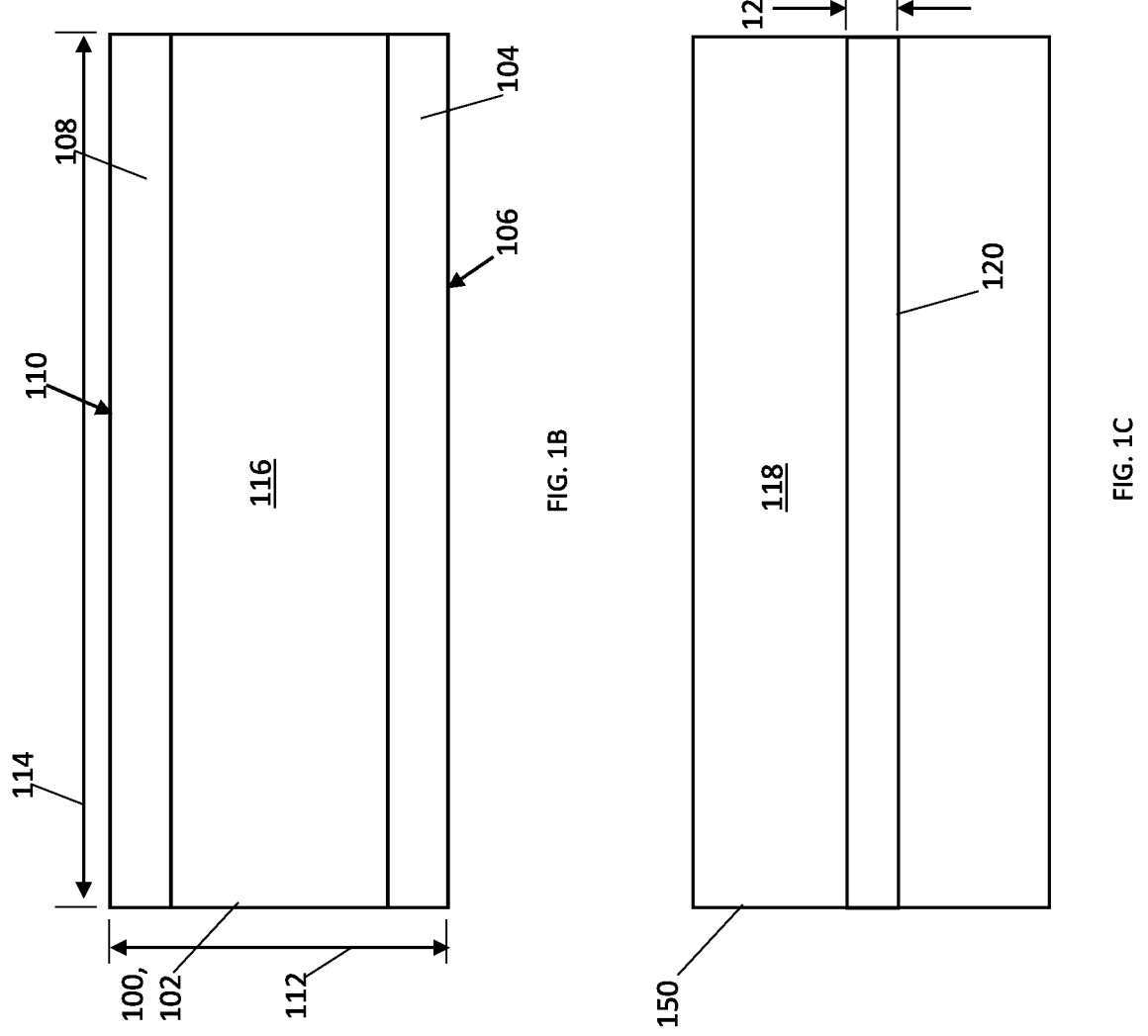
FIG. 1B is a view of a top surface the heat sink component of FIG. 1A.

Referring to FIGS. 1A and 1B, a heat sink component 100 can include a body 102 including a thermally conductive material that is electrically non-conductive. At least one first terminal 104 can be formed over a first end 106 of the body 102. At least one second terminal 108 can formed over a second end 110 of the body 102. The second end 110 of the body 102 can be opposite the first end 106 of the body 102 in an X-direction. The heat sink component 100 can have a length 112 in the X-direction and a width 114 in a Y-direction that is parallel with a top surface 116 of the body 102 and perpendicular to the X-direction. A ratio of the width 114 to the length 112 can be greater than about 1. The heat sink 100 can facilitate heat flow from the first terminal 104 to the second terminal 108.

FIG. 10 illustrates a bottom surface 118 of a heat sink component that may be generally similar to the heat sink component 100 of FIGS. 1A and 1B. The heat sink component 150 of FIG. 10 may additionally include a conductive layer 120 formed over the bottom surface 118 of the heat sink component 150. The conductive layer 120 can generally be sized to align with a conductive strip of a mounting surface, for example as described below with reference to FIG. 1D. However, the top surface 116 of the heat sink component 150 of FIG. 10 may have a variety of suitable configurations. For example, one or more of the first terminal 104 and second terminal 108 may be absent. In other embodiments, the heat sink component 150 may include multiple first terminals and/or second terminals, for example as described below with FIGS. 2 through 4B.

Figure 1D:
FIG. 1D illustrates an example component assembly including the heat sink component of FIG. 10 mounted to a mounting surface including a conductive layer configured as a stripline.

FIG. 1D illustrates an example component assembly 180 including the heat sink component 150 of FIG. 10. The conductive layer 120 of the heat sink component 150 can be coupled with a conductive strip 122 of a mounting surface 124 of the component assembly. The conductive strip 122 of the mounting surface 124 can act as a stripline conductor. For example, the conductive strip 122 may be configured to provide a 50 ohm connection. In some embodiments, the conductive strip 122 of the mounting surface 124 may have a width 126 that is approximately equal to a width 128 of the conductive layer 120 of the heat sink component 150. For example, a ratio of the width 126 of the conductive strip 122 to the width 128 of the conductive layer 120 may range from about 0.8 to about 1.2, in some embodiments from about 0.9 to about 1.1, in some embodiments from about 0.95 to about 1.05, and in some embodiments from about 0.97 to about 1.03. The component assembly 180 can include one or more heat sink components 130 connected with one or more of the first terminal 104 of the second terminal 108.

Figure 2:
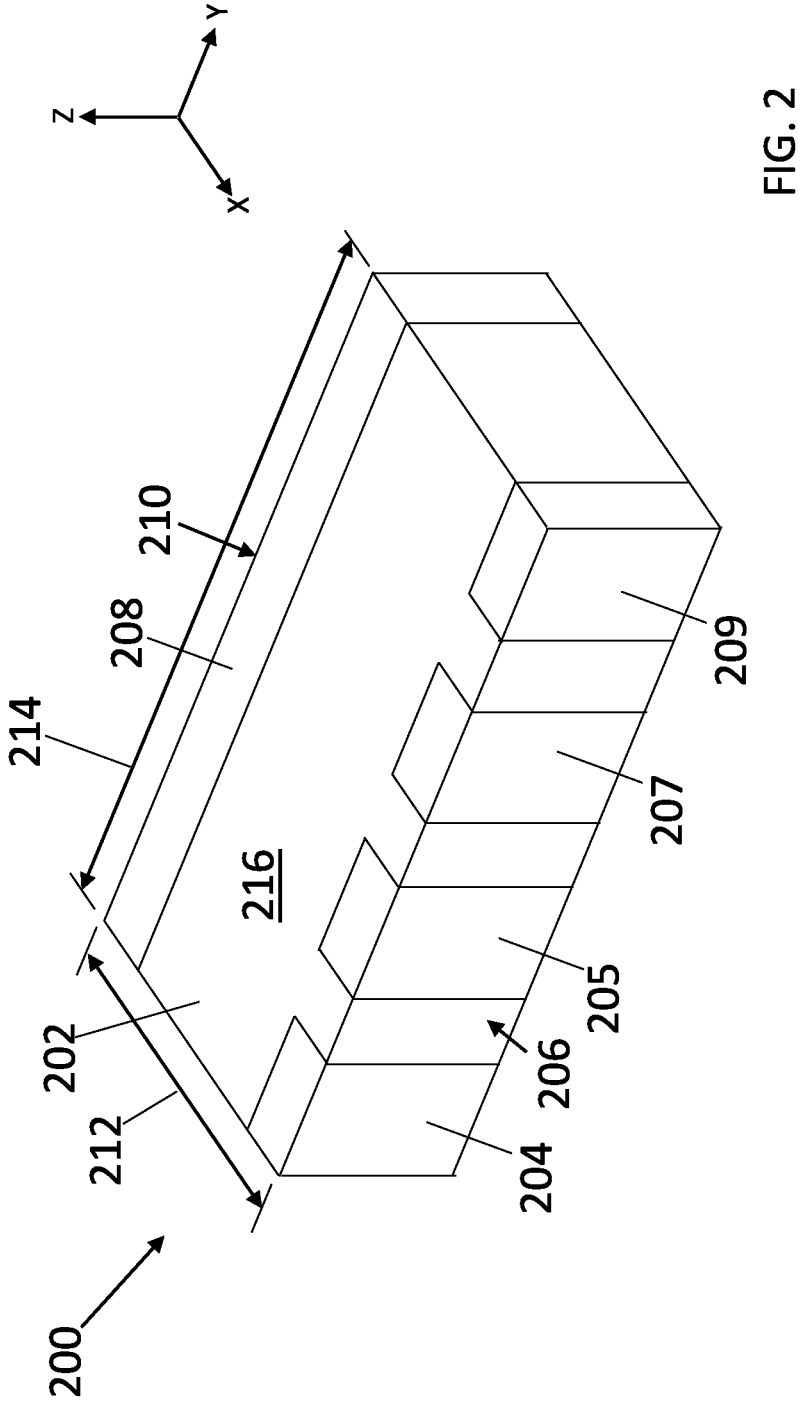
FIG. 2 illustrates an example heat sink component including multiple first terminals at a first end of the heat sink component according to aspects of the present disclosure.

FIG. 2 illustrates another example embodiment of a heat sink component 200 according to aspects of the present disclosure. Similar reference numerals are used in FIG. 2 as FIGS. 1A-1D. For example, the heat sink component 200 can include a body 202 having a first end 206 and a second end 210. In some embodiments, a plurality of first terminals 204, 205, 207, 209 can be formed over the first end 206 of the heat sink component 200. The plurality of first terminals 204, 205, 207, 209 can be separate and electrically distinct from each other. Distinct electrical components can be respectively connected with the first terminals 204, 205, 207, 209. The second terminal 208 can be connected with a heat sink terminal and/or ground terminal. As such, the heat sink component 200 can facilitate heat flow from the distinct electrical components to the heat sink terminal and/or ground terminal.

Figure 3:
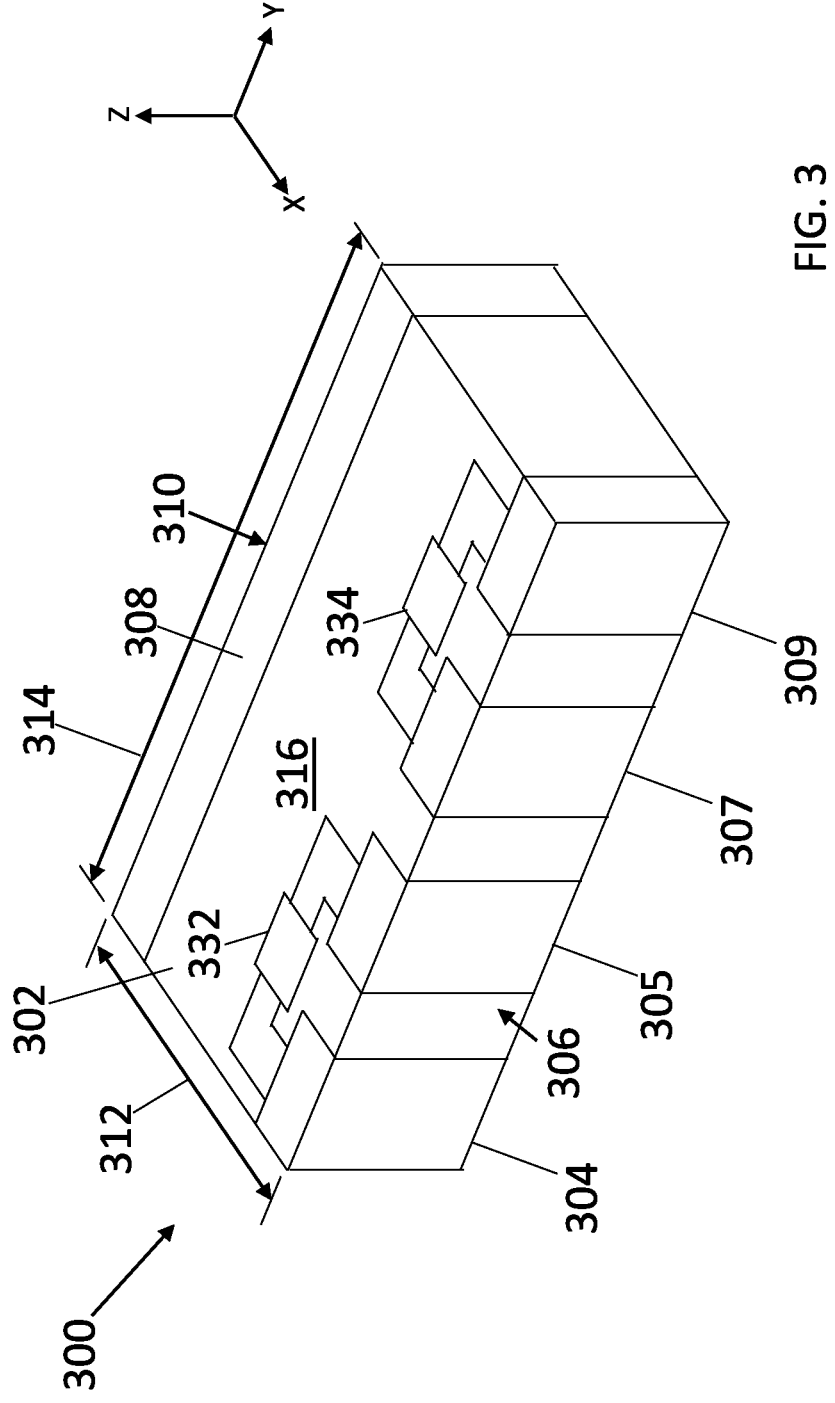
FIG. 3 illustrates an example heat sink component including multiple first terminals at a first end of the heat sink component and one or more thin film components according to aspects of the present disclosure.

FIG. 3 illustrates another example embodiment of a heat sink component 300 according to aspects of the present disclosure. Similar reference numerals are used in FIG. 3 as FIGS. 1A-1D. For example, the heat sink component 300 can include a body 302 having a first end 306 and a second end 310. A plurality of first terminals 304, 305, 307, 309 can be formed over the first end 306. One or more thin film components 332, 334 can be connected with first terminals 304, 305, 307, 309.

A first thin film component 332 can be connected between a pair of respective first terminals 304, 305. A second thin film component 334 can be connected between a different pair of respective first terminals 307, 309. The thin film components 332, 334 can include a resistor, varistor, capacitor, inductor, or a combination thereof. In this embodiment, the heat sink component 300 can facilitate heat flow from the first terminals 304, 305, 307, 309 to the second terminal 308.

Figure 4A:
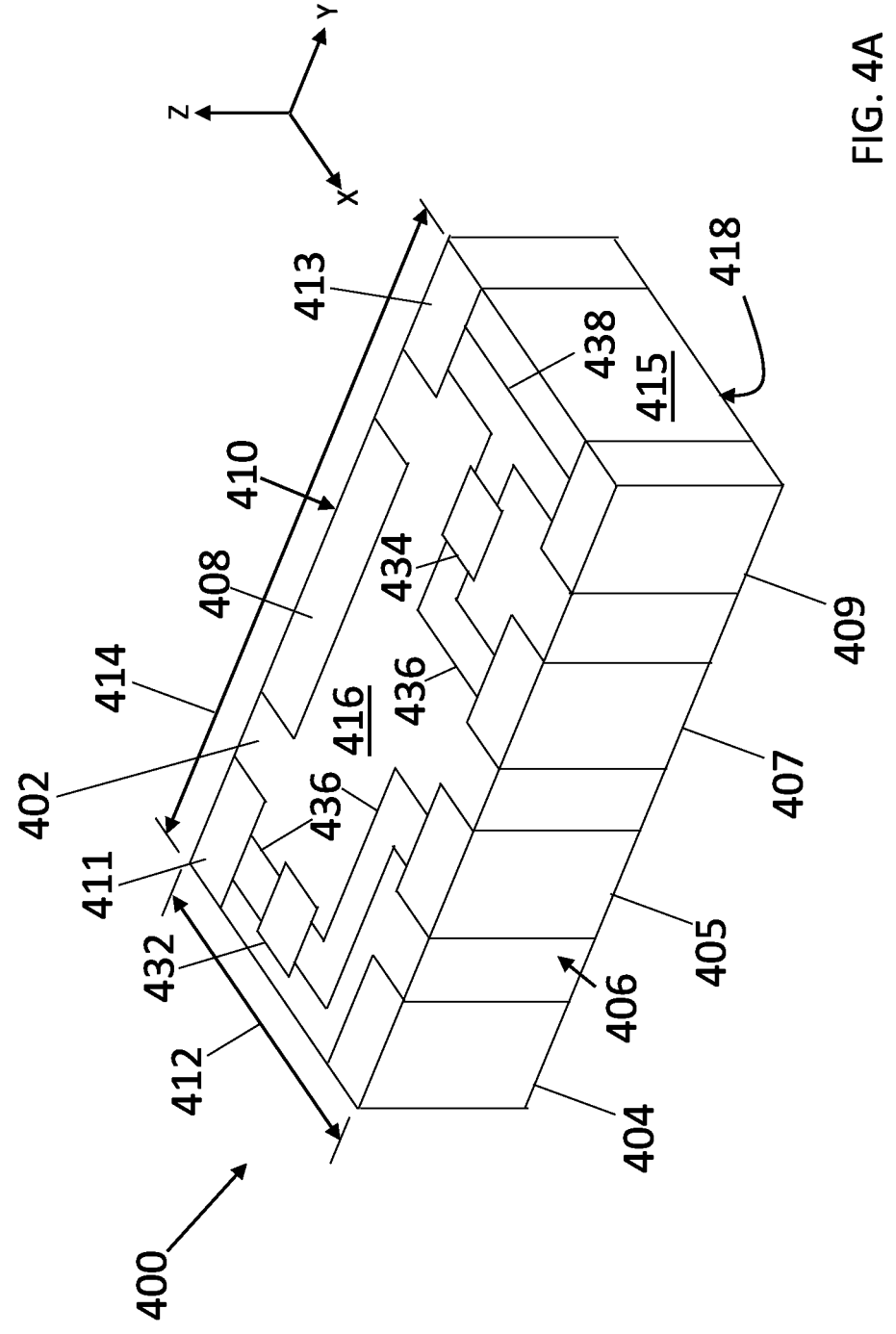
FIG. 4A illustrates an example heat sink component including thin film components and one or more conductive traces electrically connecting a pair of terminals according to aspects of the present disclosure.
Figure 4B:
FIG. 4B illustrates an example component assembly including the heat sink component of FIG. 4A according to aspects of the present disclosure.

FIG. 4A illustrates another example embodiment of a heat sink component 400, and FIG. 4B illustrates an example component assembly 401 including the heat sink component 400, according to aspects of the present disclosure. Similar reference numerals are used in FIGS. 4A and 4B as FIGS. 1A-1D. For example, the heat sink component 400 can include a body 402 having a first end 406 and a second end 410. A plurality of first terminals 404, 405, 407, 409 can be formed over the first end 406. In this example embodiment, in addition to the second terminal 408 at the second end 410, the heat sink component 400 can include one or more additional second terminals 411, 413 at the second end 410. The heat sink component 400 can include one or more thin film components 432, 434, one or more of which may be connected with the additional second terminals 411, 413. For example, a first thin film component 432 can be connected between one of the first terminals 405 at the first end 406 and an additional second terminal 411 at the second end 410. A second thin film component 434 can be connected between one of the first terminals 407 and the other additional second terminal 413 at the second end 410. Such connections can be facilitated by conductive traces 436, 438 formed on a top surface 416 of the body 402. However, the conductive traces 436, 438 can be formed on other surfaces, such as a side surface 415 or a bottom surface 418 that is opposite the top surface 416. In this example embodiment, one of the conductive traces 438 also provides an electrical connection between one of the first terminals 409 and one of the additional second terminals 413.

In this example, the heat sink component 400 can act as an interposer in addition to providing thin film components 432, 434 selectively connected between terminals 405, 411 and between terminals 409, 413. For example, as shown in FIG. 4B, the terminals 404, 405, 407, 409, 411, 413 can respectively be connected with discrete electrical components 440, 442, 444, 446, 448, 450. The second terminal 408 can be connected with a heat sink terminal 452. The heat sink component 400 can facilitate heat flow away from the discrete electrical components 440, 442, 444, 446, 448, 450 to the second terminal 408 and heat sink terminal 452. The other heat sink components 100, 200, 300 can be similarly connected with discrete electrical components, other heat sources, and/or heat sink terminals.

Figure 5:
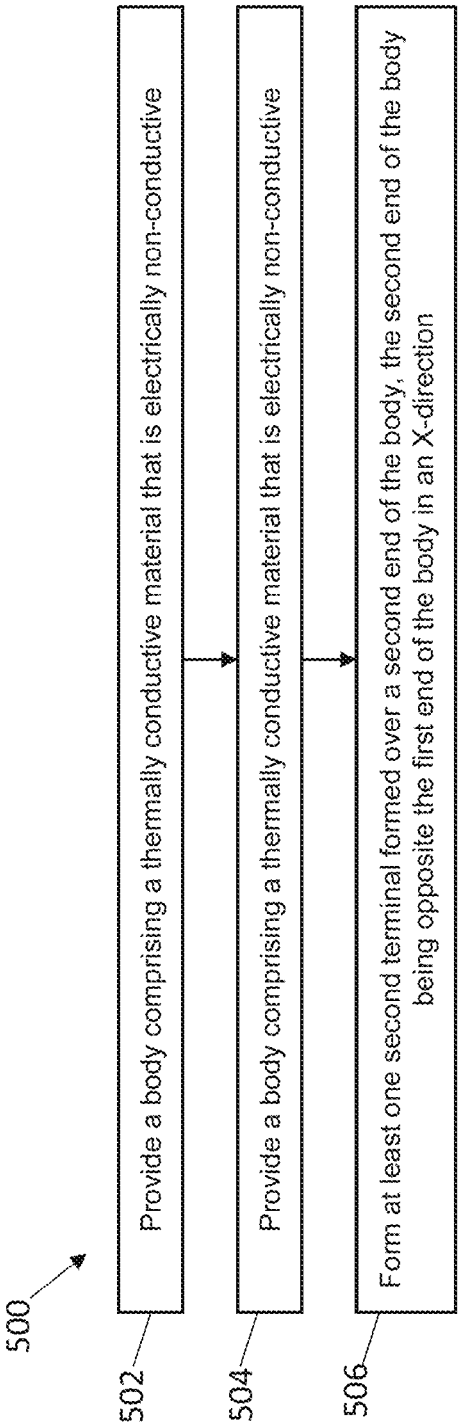
FIG. 5 is a flowchart of a method of manufacturing a circuit board including an embedded heat sink component according to aspects of the present disclosure.

FIG. 5 is a flowchart of a method 500 of manufacturing a heat sink component according to aspects of the present disclosure. In general, the method 500 will be described herein with reference to the heat sink components 100, 200, 300, 400 of FIGS. 1A-4B. However, it should be appreciated that the disclosed method 500 may be implemented with any suitable heat sink component. In addition, although FIG. 5 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method can include, at 502, providing a body comprising a thermally conductive material that is electrically non-conductive, such as aluminum nitride, beryllium oxide, or other suitable materials.

The method can include, at 504, forming at least one first terminal over a first end of the body. The method can include, at 506, forming at least one second terminal over a second end of the body. The terminals can be formed using a variety of suitable techniques, including electroless plating, electrolytic plating, or other suitable deposition techniques.

The second end of the body can be opposite the first end of the body in an X-direction. The heat sink component can have a length in the X-direction and a width in a Y-direction that is parallel with the top surface and perpendicular to the X-direction. A ratio of the width to the length is greater than about 1.

APPLICATIONS

The various embodiments of embeddable heat sink components disclosed herein may have a variety of applications. Example applications include power handling systems and monolithic microwave integrated circuit (MMIC). The heat sink component may facilitate heat flow from the terminals that are connected heat sources (e.g., distinct electrical components) to one or more terminals connected with a heat sink terminal. As examples, various embodiments suitable electrical components can be connected with the terminals of the heat sink component. As examples, the discrete electrical components can include a power amplifier, filter, synthesizer, computer component, power supply, and/or diode, for example. Specific examples of power amplifier types include Gallium Nitride (GaN) power amplifiers, high radio frequency amplifiers, and the like. Examples of diodes which may be suitable for connection with a thermal component, as described herein, may include diodes specifically adapted for use in lasers, among other types of diodes.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A heat sink component comprising:
   a body comprising a thermally conductive material that is electrically non-conductive;
   a plurality of first terminals formed over a first end of the body, the plurality of first terminals electrically distinct from each other and spaced apart from each other in a Y-direction, each first terminal of the plurality of first terminals formed over at least two surfaces of the body; and
   a plurality of second terminals formed over a second end of the body, the plurality of second terminals electrically distinct from each other and spaced apart from each other in the Y-direction, the second end of the body being opposite the first end of the body in an X-direction, each second terminal of the plurality of second terminals formed over at least two surfaces of the body,
   wherein one or more conductive traces are connected between a pair of first terminals of the plurality of first terminals and one or more conductive traces connected between at least one first terminal of the plurality of first terminals and at least one second terminal of the plurality of second terminals,
   wherein the plurality of second terminals includes a heat sink terminal, the heat sink terminal free of electrical connections,
   wherein the heat sink component has a length in the X-direction and a width in the Y-direction that is parallel with a top surface of the body and perpendicular to the X-direction, and
   wherein a ratio of the width to the length is greater than about 1.

2. The heat sink component of claim 1, wherein the plurality of first terminals are each formed over the top surface and a first end surface of the first end of the body.

3. The heat sink component of claim 1, wherein the plurality of second terminals are each formed over the top surface and a second end surface of the second end of the body.

4. The heat sink component of claim 1, further comprising at least one thin film component connected with at least one first terminal of the plurality of first terminals.

5. The heat sink component of claim 4, wherein the at least one thin film component is connected between the at least one first terminal of the plurality of first terminals and at least one second terminal of the plurality of second terminals.

6. The heat sink component of claim 4, wherein the at least one thin film component is connected between respective terminals of the plurality of first terminals.

7. The heat sink component of claim 4, wherein the at least one thin film component comprises one or more of a resistor, varistor, capacitor, or inductor.

8. The heat sink component of claim 1, wherein the heat sink component comprises a material having a thermal conductivity from about 150 W/m·° C. to about 300 W/m·° C. at about 22° C.

9. The heat sink component of claim 1, wherein the heat sink component comprises aluminum nitride or beryllium oxide.

10. A component assembly comprising:
a circuit board;
a heat sink component mounted to the circuit board, the heat sink component comprising:
a body comprising a thermally conductive material that is electrically non-conductive;
a plurality of first terminals formed over a first end of the body, the plurality of first terminals electrically distinct from each other, the plurality of first terminals each formed over the top surface and a first end surface of the first end of the body; and
a plurality of second terminals formed over a second end of the body, the plurality of second terminals electrically distinct from each other and spaced apart from each other in the Y-direction, the second end of the body being opposite the first end of the body in an X-direction,
wherein one or more conductive traces are connected between a pair of first terminals of the plurality of first terminals and one or more conductive traces connected between at least one first terminal of the plurality of first terminals and at least one second terminal of the plurality of second terminals,
wherein the plurality of second terminals includes a heat sink terminal, the heat sink terminal free of electrical connections on the body of the heat sink component,
wherein the heat sink component has a length in the X-direction and a width in a Y-direction that is parallel with a top surface of the body and perpendicular to the X-direction, and
wherein a ratio of the width to the length is greater than about 1;
a plurality of discrete electrical components mounted to the circuit board separate from the heat sink component and respectively individually connected with a respective first terminal of the plurality of first terminals; and
a circuit board heat sink terminal connected with the heat sink terminal of the plurality of second terminals.

11. The component assembly of claim 10, wherein the heat sink component further comprises at least one thin film component connected with a first terminal of the plurality of first terminals.

12. The component assembly of claim 11, wherein the at least one thin film component is connected between at least one first terminal of the plurality of first terminals and at least one second terminal of the plurality of second terminals.

13. The component assembly of claim 11, wherein the at least one thin film component is connected between respective terminals of the plurality of first terminals.

14. The component assembly of claim 11, wherein the at least one thin film component comprises one or more of a resistor, varistor, capacitor, or inductor.

15. The component assembly of claim 10, wherein the heat sink component comprises a material having a thermal conductivity from about 150 W/m·° C. to about 300 W/m·° C. at about 22° C.

16. The component assembly of claim 10, wherein the heat sink component comprises aluminum nitride.

17. The component assembly of claim 10, wherein the heat sink component comprises beryllium oxide.

18. A component assembly comprising:
a circuit board;
a heat sink component mounted to the circuit board, the heat sink component comprising:
a body comprising a thermally conductive material that is electrically non-conductive;
a first terminal, a second terminal, and a third terminal formed on the body;
a conductive trace electrically connecting the first terminal with the third terminal; and
at least one thin film component connected between the first terminal and the third terminal,
wherein the second terminal is free of electrical connections on the body of the heat sink component,
wherein the body conducts heat away from at least one of the first terminal, the second terminal, or the third terminal;
a plurality of discrete electrical components mounted to the circuit board separate from the heat sink component, a first discrete electrical component of the plurality of discrete electrical components connected with the first terminal and a second discrete electrical component of the plurality of discrete electrical components connected with the third terminal; and
a discrete heat sink terminal mounted to the circuit board separate from and adjacent to the heat sink component, the discrete heat sink terminal connected with the second terminal.

19. The component assembly of claim 18, wherein the at least one thin film component comprises one or more of a resistor, varistor, capacitor, or inductor.

20. The component assembly of claim 18, wherein the body of the heat sink component comprises a material having a thermal conductivity from about 150 W/m·° C. to about 300 W/m·° C. at about 22° C.

21. The component assembly of claim 18, wherein the body of the heat sink component comprises aluminum nitride.

22. The component assembly of claim 18, wherein the body of the heat sink component comprises beryllium oxide.

23. The component assembly of claim 18, further comprising a fourth terminal formed on the body of the heat sink component, wherein the fourth terminal is free of connections with the first terminal, second terminal, or third terminal.

24. The component assembly of claim 18, further comprising a fourth terminal formed on the body of the heat sink component, wherein the fourth terminal is free of connections with the at least one thin film component.

25. The component assembly of claim 18, wherein the heat sink component has a length in the X-direction and a width in a Y-direction that is parallel with a top surface of the body and perpendicular to the X-direction, wherein a ratio of the width to the length is greater than about 1, and wherein at least two of the first terminal, the second terminal, and the third terminal are spaced apart from one another along the width of the heat sink component.

26. The heat sink component of claim 1, wherein the heat sink component further comprises:
a conductive layer formed over a bottom surface of the body, the conductive layer spaced apart from both the first end and the second end of the body, the conductive layer extending along the width of the heat sink component from a first side of the body to a second side of the body, the first side and the second side extending between the first end and the second end of the body, wherein the bottom surface is opposite the top surface of the body along a Z-direction that is perpendicular to both the X-direction and the Y-direction.

27. The heat sink component of claim 26, wherein the conductive layer is configured as a stripline that extends from the first side to the second side of the body.

28. The heat sink component of claim 1, wherein the heat sink terminal is disposed midway along the second end of the body between a pair of second terminals.

29. The component assembly of claim 10, wherein the circuit board heat sink terminal is a discrete component mounted to the circuit board adjacent to the heat sink component.

\* \* \* \* \*